US007412215B1

(12) United States Patent
Hietala et al.

(10) Patent No.: US 7,412,215 B1
(45) Date of Patent: Aug. 12, 2008

(54) SYSTEM AND METHOD FOR TRANSITIONING FROM ONE PLL FEEDBACK SOURCE TO ANOTHER

(75) Inventors: Alexander Wayne Hietala, Phoenix, AZ (US); Jeffery Peter Ortiz, Chandler, AZ (US); Scott Robert Humphreys, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 515 days.

(21) Appl. No.: 11/144,119

(22) Filed: Jun. 3, 2005

(51) Int. Cl.
*H04B 1/04* (2006.01)

(52) U.S. Cl. .................. 455/126; 455/180.3; 455/183.1; 375/294; 375/327

(58) Field of Classification Search .................. 455/126, 455/102, 127.2, 127.1, 123, 108, 522.1, 110, 455/424, 425, 561, 136, 114.3, 550.1, 575.1, 455/456.5, 456.6, 23, 67.11, 67.16, 42, 147, 455/127.4, 260, 95, 164.1, 164.2, 180.3, 455/180.4–183.1, 76, 165.1; 375/308, 295, 375/296, 297, 298, 300, 302, 303, 305, 376, 375/283, 345, 219, 265, 294, 327, 371, 373; 330/129, 282, 86, 141, 281, 149, 136, 151; 370/205, 347, 344; 327/147, 156, 105
See application file for complete search history.

(56) References Cited

U.S. PATENT DOCUMENTS

| | | | |
|---|---|---|---|
| 5,237,288 A * | 8/1993 | Cleveland .................... 330/107 |
| 5,335,365 A * | 8/1994 | Ballantyne et al. ............. 455/76 |
| 5,430,416 A * | 7/1995 | Black et al. .................. 332/145 |
| 5,448,203 A * | 9/1995 | Matui et al. .................. 330/149 |
| 5,588,592 A * | 12/1996 | Wilson ........................... 239/4 |
| 5,982,233 A * | 11/1999 | Hellmark et al. ............. 330/149 |
| 6,043,707 A * | 3/2000 | Budnik .......................... 330/10 |
| 6,047,168 A * | 4/2000 | Carlsson et al. ............. 455/126 |
| 6,157,271 A * | 12/2000 | Black et al. .................. 332/127 |
| 6,236,267 B1 * | 5/2001 | Anzil .......................... 330/149 |
| 6,295,442 B1 * | 9/2001 | Camp et al. .................. 455/102 |
| 6,366,177 B1 | 4/2002 | McCune et al. |
| 6,377,784 B2 | 4/2002 | McCune |
| 6,480,704 B1 * | 11/2002 | Pakonen ...................... 455/126 |
| 6,606,483 B1 * | 8/2003 | Baker et al. .................. 455/126 |
| 6,633,751 B1 | 10/2003 | Damgaard et al. .......... 455/126 |
| 6,650,875 B1 * | 11/2003 | Rozenblit et al. ............. 455/91 |
| 6,836,517 B2 * | 12/2004 | Nagatani et al. ............ 375/296 |
| 7,010,276 B2 | 3/2006 | Sander et al. |

(Continued)

*Primary Examiner*—Edward Urban
*Assistant Examiner*—Charles Chow
(74) *Attorney, Agent, or Firm*—Withrow & Terranova, PLLC

(57) ABSTRACT

A system and method are provided for switching from one phase-locked loop feedback source to another in a radio frequency (RF) transmitter. The RF transmitter includes a phase-locked loop (PLL) that provides a phase-modulated RF input signal and power amplifier circuitry that amplifies the RF input signal to provide an RF output signal. The PLL includes switching circuitry that couples a feedback path of the PLL to an output of the PLL for open loop operation and couples the feedback path of the PLL to an output of the power amplifier circuitry for closed loop operation. Prior to switching the feedback path from the output of the PLL to the output of the power amplifier circuitry, time alignment circuitry operates to time-align feedback signals from the outputs of the PLL and the power amplifier circuitry such that switching from open loop operation to closed loop operation causes minimal phase disturbance.

23 Claims, 7 Drawing Sheets

U.S. PATENT DOCUMENTS

| | | | |
|---|---|---|---|
| 7,027,780 B2 * | 4/2006 | Jensen .......................... | 455/91 |
| 7,050,772 B2 * | 5/2006 | Herzberg et al. ......... | 455/191.3 |
| 7,068,980 B2 * | 6/2006 | Seo et al. ..................... | 455/91 |
| 7,085,544 B2 * | 8/2006 | Takano et al. ............... | 455/102 |
| 7,116,951 B2 * | 10/2006 | Nagode et al. .............. | 455/126 |
| 7,158,494 B2 | 1/2007 | Sander et al. | |
| 7,177,366 B1 * | 2/2007 | Dawson et al. ............. | 375/295 |
| 7,276,985 B2 * | 10/2007 | Hirano ....................... | 332/128 |
| 2001/0010713 A1 * | 8/2001 | Yamamoto .................. | 375/297 |
| 2001/0053671 A1 * | 12/2001 | Friedlander et al. ........... | 455/78 |
| 2002/0080716 A1 * | 6/2002 | Asam et al. ................. | 370/205 |
| 2003/0107434 A1 * | 6/2003 | Mitzlaff ...................... | 330/149 |
| 2005/0239433 A1 * | 10/2005 | Klein et al. ............... | 455/343.2 |
| 2006/0133559 A1 * | 6/2006 | Glass ......................... | 375/376 |

\* cited by examiner

SYSTEM AND METHOD FOR TRANSITIONING FROM ONE PLL FEEDBACK SOURCE TO ANOTHER

FIELD OF THE INVENTION

The present invention relates to phase-locked loops (PLLs) and more particularly to a method for transitioning from one PLL feedback source to another with minimal phase disturbance.

BACKGROUND OF THE INVENTION

The Global System for Mobile Communication (GSM) cellular system has recently begun service using a new modulation standard referred to as Enhanced Data rates for GSM Evolution (EDGE). This standard uses 8-Level Phase Shift Keying (8PSK) modulation. Transmitters operating according to the EDGE standard must include a modulator providing both amplitude modulation and phase modulation. To efficiently amplify such modulation, a polar system is desirable.

Polar transmitters may be classified as either open loop or closed loop. In an open loop polar transmitter, a transmit signal is broken into amplitude and phase components. The phase component is provided to the radio frequency (RF) input of a power amplifier. The amplitude component may be used to vary the supply voltage, or collector voltage, of the power amplifier such that the output power of the power amplifier follows the instantaneous amplitude of the modulation envelope, thereby providing amplitude modulation.

One issue for an open loop polar transmitter is that amplitude modulation to phase modulation (AM/PM) distortion of the power amplifier varies as the supply voltage varies. One solution to this problem is to pre-distort the phase component prior to amplification in order to compensate for the AM/PM distortion of the power amplifier. However, if the Voltage Standing Wave Ratio (VSWR) at the output of the power amplifier changes due to variations in load impedance, then the AM/PM distortion also changes. As a result, the pre-distortion no longer aligns with the AM/PM distortion of the power amplifier. At low output power levels, this is generally not an issue because the spectrum and Error Vector Magnitude (EVM) requirements of the EDGE standard are less stringent for low output power levels. At higher output power levels, this may become more of an issue because the spectrum and EVM requirements are more stringent.

A closed loop polar transmitter may be used to solve the issue of AM/PM distortion by enclosing the power amplifier within a phase-locked loop (PLL) generating the phase modulation. However, one issue for a closed loop polar transmitter is that strong interference signals present at the antenna are fed back to the PLL along with the output of the power amplifier. If the interference signal is strong enough, the interference signal will overpower the feedback from the output of the power amplifier and cause the PLL to unlock. As a result, the output of the polar transmitter is severely distorted.

Commonly owned and assigned U.S. patent application Ser. No. 11/070,704, entitled CLOSED LOOP POLAR MODULATION SYSTEM WITH OPEN LOOP OPTION AT LOW POWER LEVELS, filed Mar. 2, 2005, currently pending, which is hereby incorporated herein by reference in its entirety, discloses a polar transmitter that is configurable as either an open loop polar transmitter or a closed loop polar transmitter. The polar transmitter may be configured as an open loop polar transmitter for output power levels less than a predetermined threshold and as a closed loop polar transmitter for output levels greater than the predetermined threshold. Switching between the open loop configuration and the closed loop configuration is accomplished by switching a feedback path of a phase-locked loop (PLL) between an output of a power amplifier in the transmit chain when operating as a closed loop polar transmitter to an output of the PLL when operating as an open loop polar transmitter. However, the phase difference between the output of the power amplifier and the output of the PLL may be any angle from 0 to 360 degrees. This phase difference may cause the output of the PLL to deviate from the desired frequency such that the transmitter violates specification.

For example, for a polar transmitter performing EDGE modulation, the European Telecommunications Standardization Institute (ETSI) switching spectrum specification is −23 dBm in a 30 kHz resolution bandwidth at an offset frequency of 400 kHz. The switching spectrum is measured on a peak basis. Thus, if a transmitter fails the −23 dBm limit for any instant in time, the transmitter is out of specification. If the output power of the transmitter is −10 dBm to −5 dBm at the beginning of ramp-up for a transmit burst and the transmitter is switched from open loop to closed loop, the PLL may be momentarily pulled off of the desired frequency by 400 kHz due to the phase difference between the output of the power amplifier and the output of the PLL. As a result, the peak power level at 400 kHz may be exceeded, thereby violating the ETSI switching spectrum specification.

Thus, there remains a need for a system and method for switching from one PLL feedback source to another with minimal phase disturbance.

SUMMARY OF THE INVENTION

The present invention provides a system and method for switching from one phase-locked loop feedback source to another with minimal phase disturbance in a radio frequency transmitter. In general, the radio frequency transmitter includes modulation circuitry that provides a phase modulation signal based on input data, a phase-locked loop that provides a radio frequency (RF) input signal based on the phase modulation signal, and power amplifier circuitry that amplifies the RF input signal to provide an RF output signal. The phase-locked loop includes switching circuitry that couples a feedback path of the phase-locked loop to an output of the phase-locked loop for open loop operation and couples the feedback path of the phase-locked loop to an output of the power amplifier circuitry for closed loop operation. Prior to switching the feedback path from the output of the phase-locked loop to the output of the power amplifier circuitry, time alignment circuitry operates to time-align feedback signals from the outputs of the phase-locked loop and the power amplifier circuitry such that switching from open loop operation to closed loop operation causes minimal phase disturbance.

In one embodiment, the time alignment circuitry operates to adjust a phase of the feedback signal from the power amplifier circuitry. In another embodiment, the time alignment circuitry operates to adjust a phase of the feedback signal from the phase-locked loop.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 6:
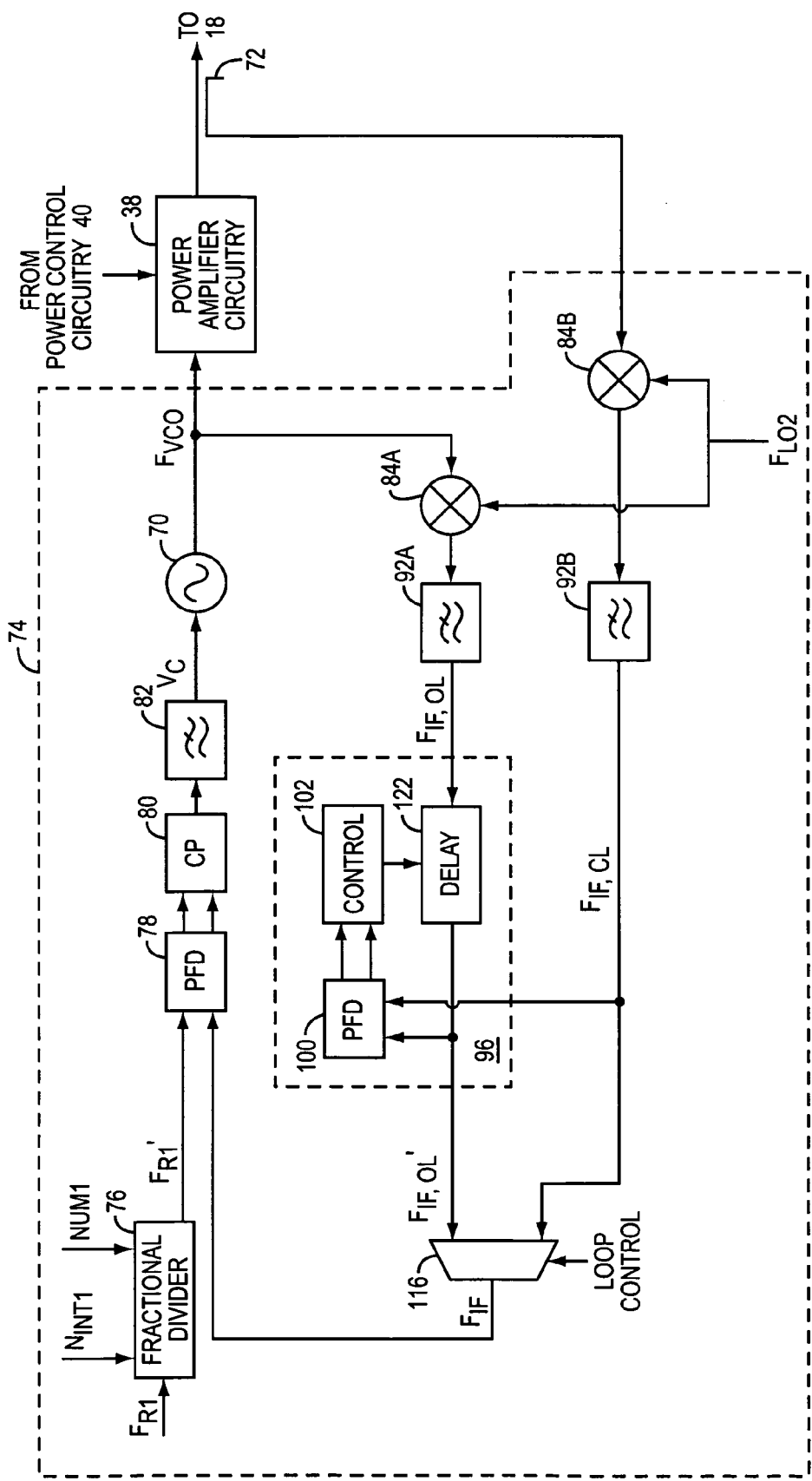
Figure 7:
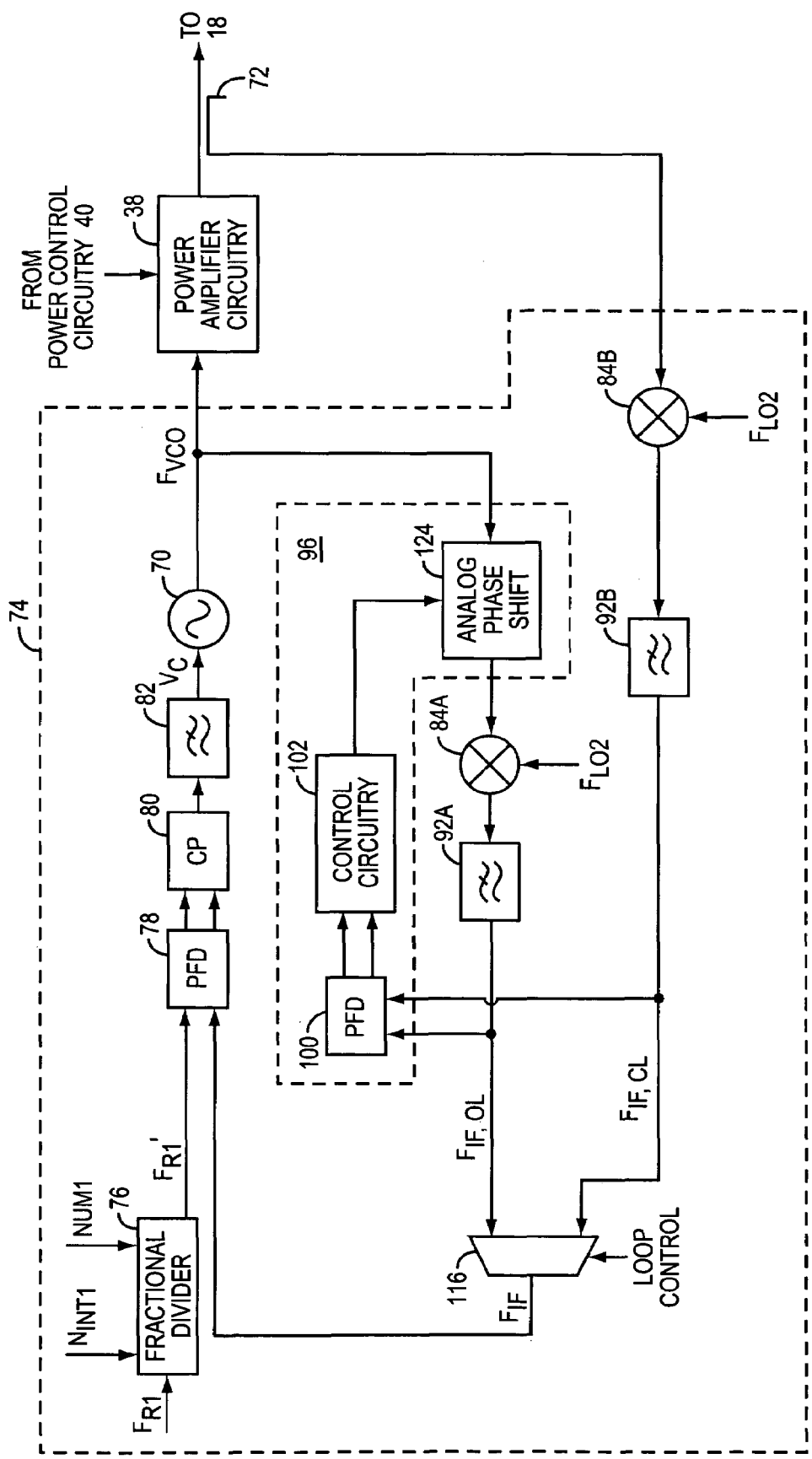

FIG. 6 illustrates a third embodiment of a system for minimizing phase distortion due to switching from the open loop configuration to the closed loop configuration according to the present invention; and FIG. 7 illustrates a fourth embodiment of a system for minimizing phase distortion due to switching from the open loop configuration to the closed loop configuration according to the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
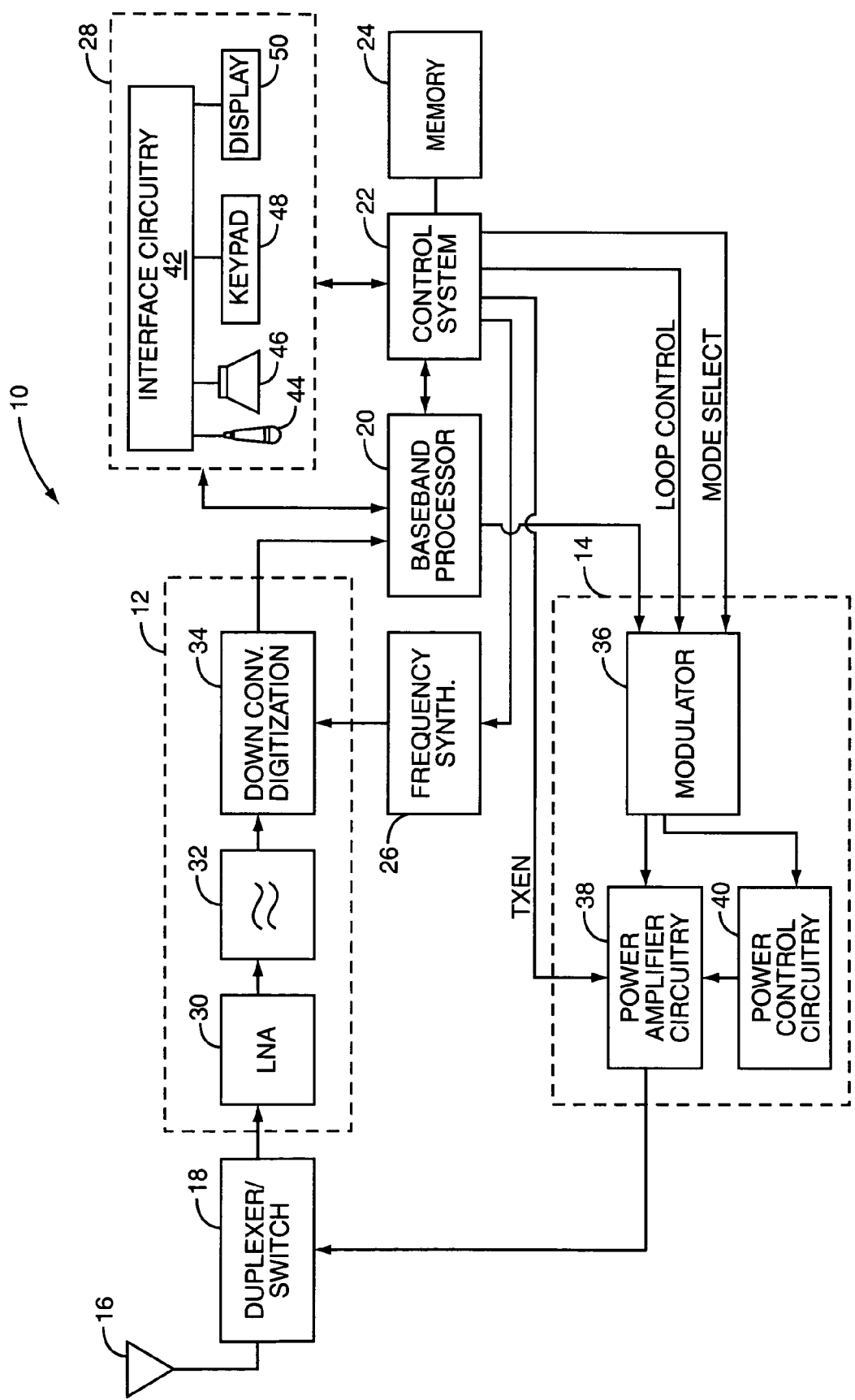
FIG. 1 is an exemplary block diagram of a mobile terminal according to one embodiment of the present invention.

The present invention is preferably incorporated in a mobile terminal 10, such as a mobile telephone, personal digital assistant, wireless Local Area Network (LAN) device, a base station in a mobile network, or other similar wireless communication device. The basic architecture of a mobile terminal 10 is represented in FIG. 1, and may include a receiver front end 12, a radio frequency (RF) transmitter 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station (not shown). A low noise amplifier 30 amplifies the signal. A filter circuit 32 minimizes broadband interference in the received signal, while downconversion and digitization circuitry 34 downconverts the filtered, received signal to an intermediate or baseband frequency signal, and digitizes the intermediate or baseband frequency signal into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The control system 22 may run software stored in the memory 24. Alternatively, the operation of the control system 22 may be a function of sequential logic structures as is well understood. After encoding the data from the control system 22, the baseband processor 20 outputs the encoded data to the RF transmitter 14.

A modulator 36 receives the data from the baseband processor 20 and, in this embodiment, operates according to one or more modulation schemes to provide a modulated signal to the power amplifier circuitry 38. The modulation scheme of the modulator 36 is controlled by a mode select signal (MODE SELECT) from the control system 22. In one embodiment, the modulator 36 operates according to either an 8-Level Phase Shift Keying (8PSK) modulation scheme, which is a modulation scheme containing both amplitude and phase components, or a Gaussian Minimum Shift Keying (GMSK) modulation scheme, which is a constant amplitude modulation scheme.

When in 8PSK mode, the modulator 36 provides a phase component at a desired transmit frequency to the power amplifier circuitry 38 and an amplitude component to the power control circuitry 40. The power control circuitry 40 controls an output power of the power amplifier circuitry 38 based on the amplitude component or, optionally, a combination of a ramping signal and the amplitude component, thereby providing amplitude modulation of the phase component. When in GMSK mode, the modulator 36 provides a phase modulated signal to the power amplifier circuitry 38 and the ramping signal to the power control circuitry 40, where the power control circuitry 40 controls the output power of the power amplifier circuitry 38 based on the ramping signal.

The power amplifier circuitry 38 amplifies the modulated signal from the modulator 36 to a level appropriate for transmission from the antenna 16. A gain of the power amplifier circuitry 38 is controlled by the power control circuitry 40. In essence, the power control circuitry 40 operates to control a supply voltage provided to the power amplifier circuitry 38 based on the amplitude component or, optionally, a combination of the amplitude component and the ramping signal from the modulator 36 when in the 8PSK mode and based on the ramping signal when in GMSK mode.

A user may interact with the mobile terminal 10 via the interface 28, which may include interface circuitry 42 associated with a microphone 44, a speaker 46, a keypad 48, and a display 50. The interface circuitry 42 typically includes analog-to-digital converters, digital-to-analog converters, amplifiers, and the like. Additionally, it may include a voice encoder/decoder, in which case it may communicate directly with the baseband processor 20.

The microphone 44 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 46 by the interface circuitry 42. The keypad 48 and display 50 enable the user to interact with the mobile terminal 10, input numbers to be dialed and address book information, or the like, as well as monitor call progress information.

Figure 2:
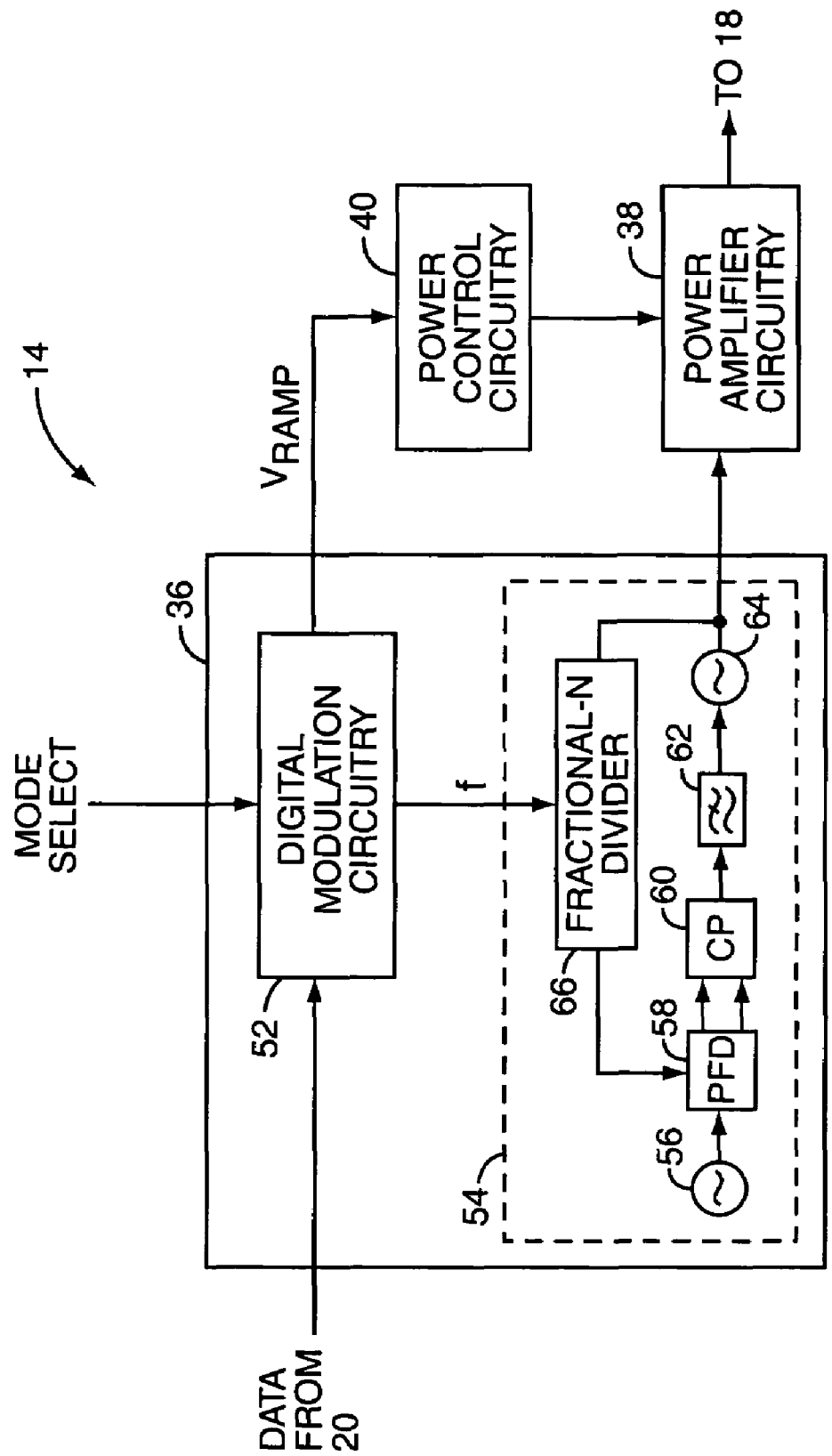
FIG. 2 illustrates the radio frequency transmitter of FIG. 1 including a more detailed block diagram of an exemplary modulator for an open loop transmitter.

FIG. 2 illustrates an exemplary embodiment of the modulator 36 wherein the modulator 36 operates in either an 8PSK (8-Level Phase Shift Keying) mode or GMSK (Gaussian Minimum Shift Keying) mode. It should be noted that 8PSK and GMSK are exemplary modulation schemes and are not intended to limit the scope of the present invention. The modulator 36 includes digital modulation circuitry 52 and a phase-locked loop 54. Exemplary embodiments of the digital modulation circuitry 52 can be found in commonly owned and assigned U.S. Pat. No. 6,834,084, entitled DIRECT DIGITAL POLAR MODULATOR, issued Dec. 21, 2004; U.S. Patent Application Publication No. 2003/0215025, entitled AM TO PM CORRECTION SYSTEM FOR POLAR MODULATOR, published Nov. 20, 2003; and U.S. Patent Application Publication No. 2003/0215026, entitled AM TO AM CORRECTION SYSTEM FOR POLAR MODULATOR, published Nov. 20, 2003, which are hereby incorporated herein by reference in their entireties.

In general, the digital modulation circuitry 52 receives digital data (DATA) from the baseband processor 20 (FIG. 1) and processes the data according to either an 8PSK modulation scheme or a GMSK modulation scheme depending on the mode select signal (MODE SELECT). In 8PSK mode, the digital modulation circuitry 52 provides a frequency deviation signal (f) corresponding to a desired phase modulation and an analog adjustable power control signal ($V_{RAMP}$) including an amplitude modulation component. The frequency deviation signal (f) is also referred to herein as a phase modulation signal. In one embodiment, the adjustable power control signal ($V_{RAMP}$) is a combination of the amplitude modulation component, a ramping signal defining a transmit burst, and a power amplifier gain setting that controls the output power level of the power amplifier circuitry 38.

In GMSK mode, the digital modulation circuitry 52 provides the frequency deviation signal (f) corresponding to the desired modulation. However, in GMSK mode, the adjustable power control signal ($V_{RAMP}$) does not include an amplitude modulation component and is used to provide the desired output. The adjustable power control signal ($V_{RAMP}$) may be a combination of a ramping signal and a power amplifier gain setting.

For either 8PSK or GMSK modulation, the PLL 54 generates a modulated output signal at the desired radio frequency based on the frequency deviation signal (f). In the exemplary embodiment illustrated, the PLL 54 includes a reference oscillator 56, a phase detector (PFD) 58, a charge pump 60, a loop filter 62, a voltage controlled oscillator (VCO) 64, and a fractional-N divider 66. The operational details of the PLL 54 will be apparent to one of ordinary skill in the art upon reading this disclosure. In general, the phase detector 58 compares a phase of a reference signal provided by the reference oscillator 56 with a divided signal provided by the fractional-N divider 66. Based on the comparison of the reference signal and the divided signal, the phase detector 58 provides pump-up and pump-down control signals to the charge pump 60. Based on the pump-up and pump-down control signal, the charge pump 60 generates an output signal, which is low-pass filtered by the loop filter 62 to provide a control signal to the VCO 64.

Since the power amplifier circuitry 38 is not enclosed within the PLL 54, the RF transmitter 14 is an open loop transmitter. One issue with the open loop RF transmitter 14 of FIG. 2 is that that the load impedance seen at the output of the power amplifier circuitry 38 may vary due to environmental changes such as the user placing the antenna 16 (FIG. 1) near his or her body. As a result, the Voltage Standing Wave Ratio (VSWR) at the output of the power amplifier circuitry 38 changes, and the AM/PM distortion characteristic of the power amplifier circuitry 38 also changes. Because of the change in the AM/PM characteristic of the power amplifier circuitry 38, AM/PM compensation circuitry within the digital modulation circuitry 52 may no longer precisely compensate the AM/PM distortion of the power amplifier circuitry 38 such that the output of the power amplifier circuitry 38 contains residual AM/PM distortion.

One solution to this issue is to alter the design of the RF transmitter 14 of FIG. 2 such that the RF transmitter 14 is a closed loop transmitter. This could be done by enclosing the power amplifier circuitry 38 within the loop of the PLL 54 such that the phase distortion is removed from the output of the power amplifier circuitry 38.

However, one problem associated with converting the RF transmitter 14 of FIG. 2 into a closed loop transmitter by enclosing the power amplifier circuitry 38 within the PLL 54 is that a strong interference signal may be present at the antenna 16 while transmitting. This interference signal may be strong enough to overpower the feedback from the output of the power amplifier circuitry 38 such that the PLL 54 unlocks. As an example, the interference signal may be strong enough to overpower the feedback from the output of the power amplifier circuitry 38 such that the PLL 54 unlocks if the power level of the interference signal is greater than about 6 dB less than the output power level of the power amplifier circuitry 38. However, 6 dB is exemplary and may vary depending on the particular implementation. As a result of the unlocking of the PLL 54, the output of the RF transmitter 14 would be severely distorted, which would be detrimental to both the mobile terminal 10 and to other radio systems near the mobile terminal 10.

This is particularly an issue when the output power of the power amplifier circuitry 38 is set to a low output power level, and more particularly when the output power is set to a minimum output power level. For example, when operating at a minimum output power level according to the EDGE modulation standard, the average output power may be as low as 0 dBm with minimum envelope excursions, or valleys, dropping to −14 dBm. Thus, for our example, the interference signal seen at the output of the power amplifier circuitry 38 would have to be less than −20 dBm to avoid unlocking the PLL 54. If the interference source is a transmitter transmitting at 33 dBm, then a minimum separation between the mobile terminal 10 and the interference source in order to prevent unlocking of the PLL 54 would be more than ten feet. Thus, if the interference signal source is within ten feet of the mobile terminal 10, the interference signal may cause the PLL 54 to unlock on every valley in the modulation, thereby substantially degrading the performance of the mobile terminal 10.

Figure 3:
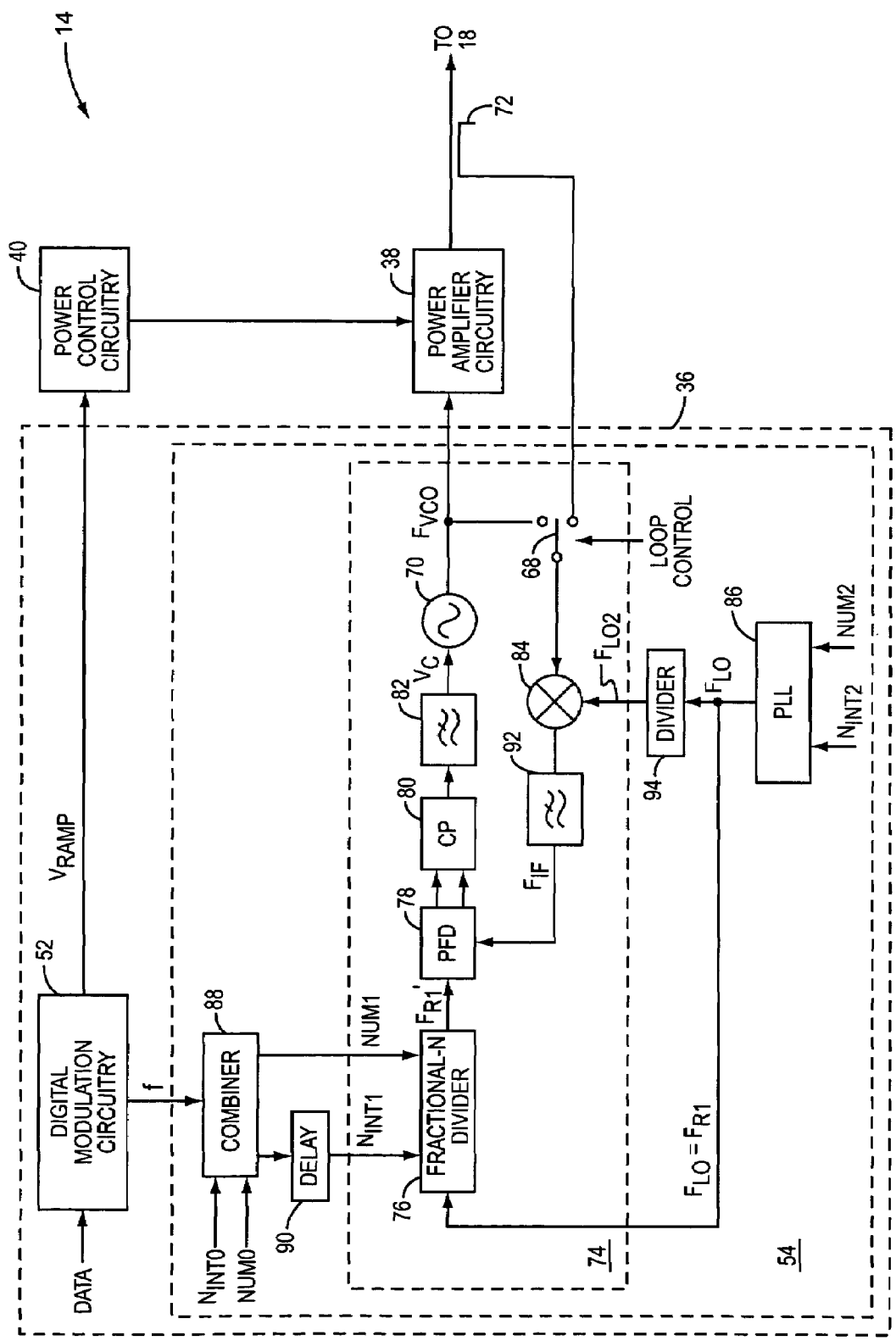
FIG. 3 illustrates an exemplary transmitter configurable as either an open loop polar transmitter or a closed loop polar transmitter.

FIG. 3 is an exemplary embodiment of the RF transmitter 14 that operates in either a closed loop mode of operation or an open loop mode of operation according to one embodiment of the present invention. In this embodiment, the PLL 54 is a Fractional-N Offset PLL (FN-OPLL) such as that disclosed in commonly owned and assigned U.S. patent application Ser. No. 11/047,258 entitled FRACTIONAL-N OFFSET PHASE LOCKED LOOP, which was filed on Jan. 31, 2005 and is hereby incorporated by reference in its entirety.

For the open loop mode of operation, the loop control signal (LOOP CONTROL) is provided in a first state such that switching circuitry 68 couples a feedback path of the PLL 54 to an output of VCO 70, which in this embodiment is the output of the PLL 54. As such, the power amplifier circuitry 38 is not enclosed within the PLL 54. For the closed loop mode of operation, a directional coupler 72 provides a feedback signal indicative of the output signal of the power amplifier circuitry 38, and the loop control signal (LOOP CONTROL) is provided in a second state such that the switching circuitry 68 couples the feedback path of the PLL 54 to the directional coupler 72, thereby enclosing the power amplifier circuitry 38 within the PLL 54.

The modulator 36 is switched to the open loop mode of operation when the mobile terminal 10 is transmitting at low output power levels, thereby preventing or at least substantially reducing the probability that the PLL 54 will be unlocked due to strong interference signals. When the average output power of the mobile terminal 10 is above a predetermined threshold, the modulator 36 is switched to the closed loop mode of operation. In one embodiment, the threshold is +12 dBm such that the RF transmitter 14 is configured as an open loop transmitter when the output power level of the mobile terminal 10 is less than 12 dBm and configured as an open loop transmitter when the output of the mobile terminal 10 is greater than or equal to 12 dBm. In another embodiment, the threshold may be in the range of +10 to +15 dBm depending on the particular design.

Preferably, for each transmit burst, the power amplifier circuitry 38 is not activated until the PLL 54 is locked to the desired frequency. Thus, the modulator 36 is switched to the open loop mode of operation prior to each transmit burst in order to lock the PLL 54 to the desired frequency before the power amplifier circuitry 38 is activated. After the PLL 54 is locked and once the power amplifier circuitry 38 is activated, the modulator 36 is switched to the closed loop mode of operation prior to the beginning of ramp-up for the transmit burst if the desired output power level is greater than the threshold. If the desired output power level is less than the threshold, the modulator 36 remains in the open loop mode of operation.

The PLL 54 includes a first PLL 74, which includes a fractional-N divider 76, phase detector 78, charge pump 80, loop filter 82, the VCO 70, and a mixer 84. The PLL 54 also includes a second PLL 86. It should be noted that the second PLL 86 may also be used as the frequency synthesizer 26 (FIG. 1) for the mobile terminal 10 when in receive mode. In operation, the fractional-N divider 76 fractionally divides a local oscillator frequency signal ($F_{LO}$), which is the output of the second PLL 86, and a reference frequency ($F_{R1}$) for the first PLL 74, based on an integer value ($N_{INT1}$) and a fractional value (NUM1) to provide reference signal ($F_{R1}'$).

The values $N_{INT1}$ and NUM1 are generated by combiner circuitry 88 based on a modulation signal, which in this embodiment corresponds to the frequency deviation signal (f) from the digital modulation circuitry 52, and integer and fractional values $N_{INT0}$ and NUM0. The integer and fractional values $N_{INT0}$ and NUM0 define an initial fractional divide value ($N_0$), which corresponds to a desired center or carrier frequency of the output signal ($F_{VCO}$). The integer and fractional values $N_{INT0}$ and NUM0 may be provided by the control system 22 (FIG. 1).

In one embodiment, the combiner circuitry 88 combines the initial fractional divide value ($N_0$) and the modulation signal (f) using the following equation:

$$N = N_0 + \text{Modulation, where}$$

$$N = N_{INT1}.\text{NUM1, and}$$

N is a combined divider value and "Modulation" is the frequency deviation signal (f). The value $N_{INT1}$ is an integer portion of the combined divider value and NUM1 is a fractional part of the combined divider value.

The value $N_{INT1}$ is passed to delay circuitry 90 which delays the value $N_{INT1}$ with respect to the value NUM1. The delay ensures that the values $N_{INT1}$ and NUM1 are aligned at the fractional-N divider 76.

Since the fractional divide value ($N_{INT1}$.NUM1) of the fractional-N divider 76 is provided by the combiner circuitry 88 based on the frequency deviation signal (f), the local oscillator signal ($F_{LO}$) is fractionally divided based on the frequency deviation signal (f), thereby controlling the output signal ($F_{VCO}$) of the PLL 54 such that it is a phase or frequency modulated signal. Further, in one embodiment, the frequency deviation signal (f) is a digital signal such that the PLL 54 provides a digital modulation interface.

The phase detector 78 compares the fractionally divided reference signal ($F_{R1}'$) output by the fractional-N divider 76 to an intermediate frequency signal ($F_{IF}$). The output of the phase detector 78 is provided to the charge pump 80. More specifically, the phase detector 78 provides a pump-up and a pump-down signal to the charge pump 80 based on the comparison of the fractionally divided reference signal ($F_{R1}'$) and the intermediate frequency signal ($F_{IF}$). The output of the charge pump 80 is filtered by the loop filter 82 and provided to the VCO 70 as a control voltage ($V_C$). The loop filter 82 is designed such that the first PLL 74 has a wide open-loop unity-gain bandwidth. In one embodiment, the first PLL 74 has a bandwidth in the range of 1.2 MHz to 1.5 MHz. Based on the control voltage ($V_C$), the VCO 70 provides the output signal ($F_{VCO}$). The output of the VCO 70 is the modulated signal and is provided to the power amplifier circuitry 38.

When in the open loop mode of operation, the switching circuitry 68 is controlled such that the output of the VCO 70 is coupled to a feedback path of the first PLL 74. The feedback path of the first PLL 74 includes the mixer 84 and optionally a feedback filter 92. It should be noted that the switching circuitry 68 is illustrated in FIG. 3 as part of the PLL 54. However, the switching circuitry 68 may be separate from the PLL 54. When in the closed loop mode of operation, the output of the power amplifier circuitry 38 is coupled to the feedback path of the first PLL 74 via the directional coupler 72.

Whether the feedback signal is from the output of the VCO 70 or the output of the power amplifier circuitry 38, the mixer 84 operates to multiply the feedback signal by a divided local oscillator signal ($F_{LO2}$). It should be noted that additional divider circuits may be placed between the VCO 70 and the mixer 84 depending on the particular implementation. The divided local oscillator signal ($F_{LO2}$) is provided by a divider 94, which operates to divide the local oscillator signal ($F_{LO}$) from the second PLL 86 by an integer divide value. The divider 94 may alternatively be a fractional-N divider. It should be noted that the divider 94 is optional, and the local oscillator signal ($F_{LO}$) may alternatively be provided to the mixer 84.

In operation, the mixer 84 multiplies the feedback signal, which has a frequency substantially equal to the frequency $F_{VCO}$, and the divided local oscillator signal ($F_{LO2}$), thereby downconverting the feedback signal to provide the intermediate frequency signal ($F_{IF}$). The output of the mixer 84 may include a high frequency component at a frequency equal to the frequency of the feedback signal plus the frequency of the divided local oscillator signal ($F_{LO2}$) and a low frequency component at a frequency equal to a difference of the frequency of the feedback signal and the frequency of the divided local oscillator signal ($F_{LO2}$), as commonly known. Thus, the output of the mixer 84 may optionally be filtered by the feedback filter 92 to remove the high frequency component and thereby provide the intermediate frequency signal ($F_{IF}$) to the phase detector 78.

The frequency of the local oscillator signal ($F_{LO}$) is controlled by an external component, such as the control system 22 (FIG. 1), by controlling the control inputs ($N_{INT2}$ and NUM2) provided to the PLL 86. Accordingly, the control inputs $N_{INT2}$ and NUM2 may be controlled for channel selection and for spur avoidance.

One issue with the modulator 36 of FIG. 3 is that the phase difference between the output of the power amplifier circuitry 38 and the output of the PLL 54 may be any angle from 0 to 360 degrees. When the RF transmitter 14 is switched from the open loop configuration to the closed loop configuration, this phase difference may cause the output of the PLL 54 to deviate from the desired frequency. Even if the switch occurs at a minimum output power level, the phase difference may cause the RF transmitter 14 to violate specification.

For example, if the RF transmitter 14 is operating according to the GSM specification and the EDGE modulation standard, the ETSI switching spectrum specification is −23 dBm in a 30 kHz resolution bandwidth and an offset frequency of 400 kHz. The switching spectrum is measured on a peak basis. Thus, if the RF transmitter 14 fails the −23 dBm limit for any instant in time, it is out of specification. If the RF transmitter 14 is switched from open loop to closed loop at the beginning of ramp-up for a transmit burst when the output power of the RF transmitter 14 is −10 dBm to −5 dBm, the PLL 54 may be momentarily pulled off of the desired frequency by 400 kHz due to the phase difference between the output of the power amplifier circuitry 38 and the output of the PLL 54. As a result, the peak power level at 400 kHz may be exceeded, thereby violating the ETSI switching spectrum specification.

The present invention provides a system and method for switching from one PLL feedback source to another with minimal phase disturbance. More specifically, the present invention provides a time alignment system for adjusting the phase of either the feedback signal from the output of the PLL 54 or the feedback signal from the output of the power amplifier circuitry 38 prior to switching from the open loop to closed loop. Thus, when the switch over occurs, the phase difference between the two feedback signals will be essentially zero, thereby minimizing phase disturbance.

Time alignment is performed during a period when the output of the PLL 54 and the output of the power amplifier circuitry 38 are essentially the same sine wave pattern. For example, if the RF transmitter 14 is operating according to the EDGE modulation standard of the GSM specification, time alignment is preferably performed during the guard time and tail bits during and before ramp-up when the 8PSK modulation is restricted by ETSI specifications to use a data pattern of all 1's. This results in a constant envelope signal, where both the output of the PLL 54 and the output of the power amplifier circuitry 38 are the same sine wave pattern. In one embodiment, time alignment and switch over from open loop to closed loop are performed between about 8 to 18 quarter symbol times before the center of the first tail symbol, depending on the desired ramp shape and length.

Figure 4:
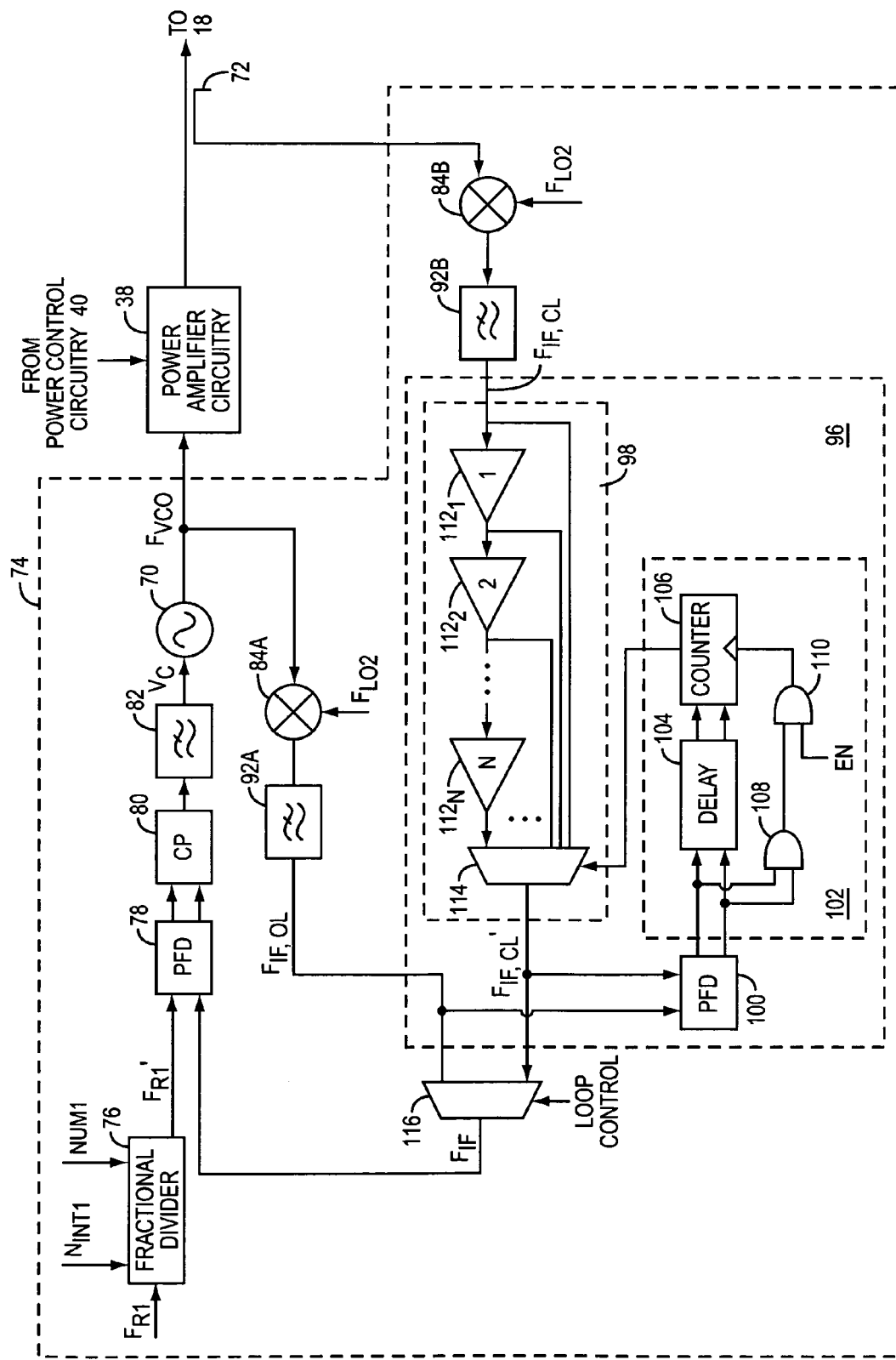
FIG. 4 illustrates a first embodiment of a system for minimizing phase distortion due to switching from the open loop configuration to the closed loop configuration according to the present invention.

One embodiment of the present invention is illustrated in FIG. 4. The embodiment of FIG. 4 is similar to that of FIG. 3, however, for clarity, some of the elements shown in FIG. 3 have been omitted. In this embodiment, both of the feedback signals are first downconverted to an intermediate frequency by mixers 84A and 84B, respectively, thereby providing downconverted feedback signals ($F_{IF,OL}$, $F_{IF,CL}$). Feedback filters 92A and 92B operate to remove the high frequency components from the downconverted feedback signals ($F_{IF,OL}$, $F_{IF,CL}$). Downconversion to an intermediate frequency is beneficial because switching between the two feedback signals at an intermediate frequency requires less isolation than switching between the two feedback signals at a radio frequency.

A time alignment system 96 operates to adjust a phase of the downconverted feedback signal ($F_{IF,CL}$) from the output of the power amplifier circuitry 38 to provide a phase-adjusted signal ($F_{IF,CL}'$) that is in phase with the downconverted feedback signal ($F_{IF,OL}$). In general, the time alignment system 96 compares a phase of the downconverted feedback signal ($F_{IF,OL}$) to a phase of the phase-adjusted feedback signal ($F_{IF,CL}'$). Based on this comparison, the time alignment system 96 adjusts a phase of the downconverted feedback signal ($F_{IF,CL}$) from the output of the power amplifier circuitry 38 to provide the phase-adjusted feedback signal ($F_{IF,CL}'$) that is in phase with the downconverted feedback signal ($F_{IF,OL}$).

More specifically, the time alignment system 96 includes delay circuitry 98, a phase detector 100, and control circuitry 102. The delay circuitry 98 operates to delay the downconverted feedback signal ($F_{IF,CL}$) provided by the mixer 84B to provide the phase-adjusted feedback signal ($F_{IF,CL}'$). The phase detector 100 compares the phase of phase-adjusted feedback signal ($F_{IF,CL}'$) to the phase of the downconverted feedback signal ($F_{IF,OL}$). Based on the comparison, the phase detector 100 provides a phase detection signal to the control circuitry 102. The control circuitry 102 adjusts the delay of the delay circuitry 98 based on the phase detection signal. After a number of iterations, the delay of the delay circuitry 98 is adjusted such that the two feedback signals ($F_{IF,OL}$, $F_{IF,CL}'$) are in-phase.

The phase detection signal provided by the phase detector 100 includes a pump-up and a pump-down signal. The control circuitry 102 includes delay circuitry 104, counter 106, and AND gates 108 and 110 arranged as shown. In general, when the pulse width of the pump-up signal is greater than the pulse width of the pump-down signal, the count provided by the counter 106 is incremented. When the pulse-width of the pump-down signal is greater than the pulse-width of the pump-up signal, the count provided by the counter 106 is decremented. The output of the counter 106 controls the delay of the delay circuitry 98.

The delay circuitry 98 includes a number (N) of delays $112_1$-$112_N$, which may be inverters or buffers, creating N+1 taps. In one embodiment, there are 255 delays creating 256 taps. Each tap is coupled to a multiplexer 114. The multiplexer 114 selects one of the taps based on the count value provided by counter 106, thereby providing the phase-adjusted feedback signal ($F_{IF,CL}'$). Note that initially the output of the counter 106 may be set to an intermediate value, such as 128, such that the delay provided by the delay circuitry 98 may be increased or decreased depending on the phase difference detected by the phase detector 100.

Multiplexer 116 receives the feedback signals ($F_{IF,OL}$, $F_{IF,CL}'$) and provides one of these signals to the phase detector 78 as the intermediate frequency signal ($F_{IF}$) based on the loop control signal (LOOP CONTROL). For the open loop configuration, the multiplexer 116 provides the downconverted feedback signal ($F_{IF,OL}$) to the phase detector 78 as the intermediate frequency signal ($F_{IF}$). For the closed loop configuration, the multiplexer 116 provides the phase-adjusted feedback signal ($F_{IF,CL}'$) to the phase detector 78 as the intermediate frequency signal ($F_{IF}$).

In operation, when it is desirable to initially lock the PLL 54 (FIG. 3), the loop control signal (LOOP CONTROL) is provided such that the downconverted feedback signal $F_{IF,OL}$) is provided to the phase detector 78. The control circuitry 102 may be disabled. When it is desirable to switch from open loop to closed loop, the time alignment system 96 is enabled to adjust the phase of the feedback signal from the output of the power amplifier circuitry 38 such the phase-adjusted feedback signal ($F_{IF,CL}'$) is in-phase with the downconverted feedback signal ($F_{IF,OL}$). Once time alignment is complete, the time alignment system 96 holds the delay of the delay circuitry 114 fixed. The loop control signal (LOOP CONTROL) is then provided such that the multiplexer 116 provides the phase-adjusted feedback signal ($F_{IF,CL}'$) to the phase detector 78, thereby enclosing the power amplifier circuitry 38 within the PLL 54 for closed loop operation. Since the phase-adjusted feedback signal ($F_{IF,CL}'$) is in phase with the downconverted feedback signal ($F_{IF,OL}$), there is little or no phase disturbance. Note that the mixers 84A and 84B may be disabled in order to reduce current drain when their corresponding feedback paths are not in use.

The advantage of the time alignment system 96 of FIG. 4 is that the phase adjustment of the downconverted feedback signal ($F_{IF,CL}$) occurs outside of the PLL 54 (FIG. 3). As such, the time alignment system 96 has essentially no settling time other than gate delays and can operate at a very high clock rate. For example, assume that the downconverted feedback signals ($F_{IF,OL}$, $F_{IF,CL}$) are at a frequency of 100 MHz. Then, once each 10 ns the phase detector 100 operates to increment or decrement the count of the counter 106. If there are 256 taps and the initial delay corresponds to the 128th tap, then the maximum time needed to sweep all possible delays is 128×10 ns, which is 1.28 microseconds.

Figure 5:
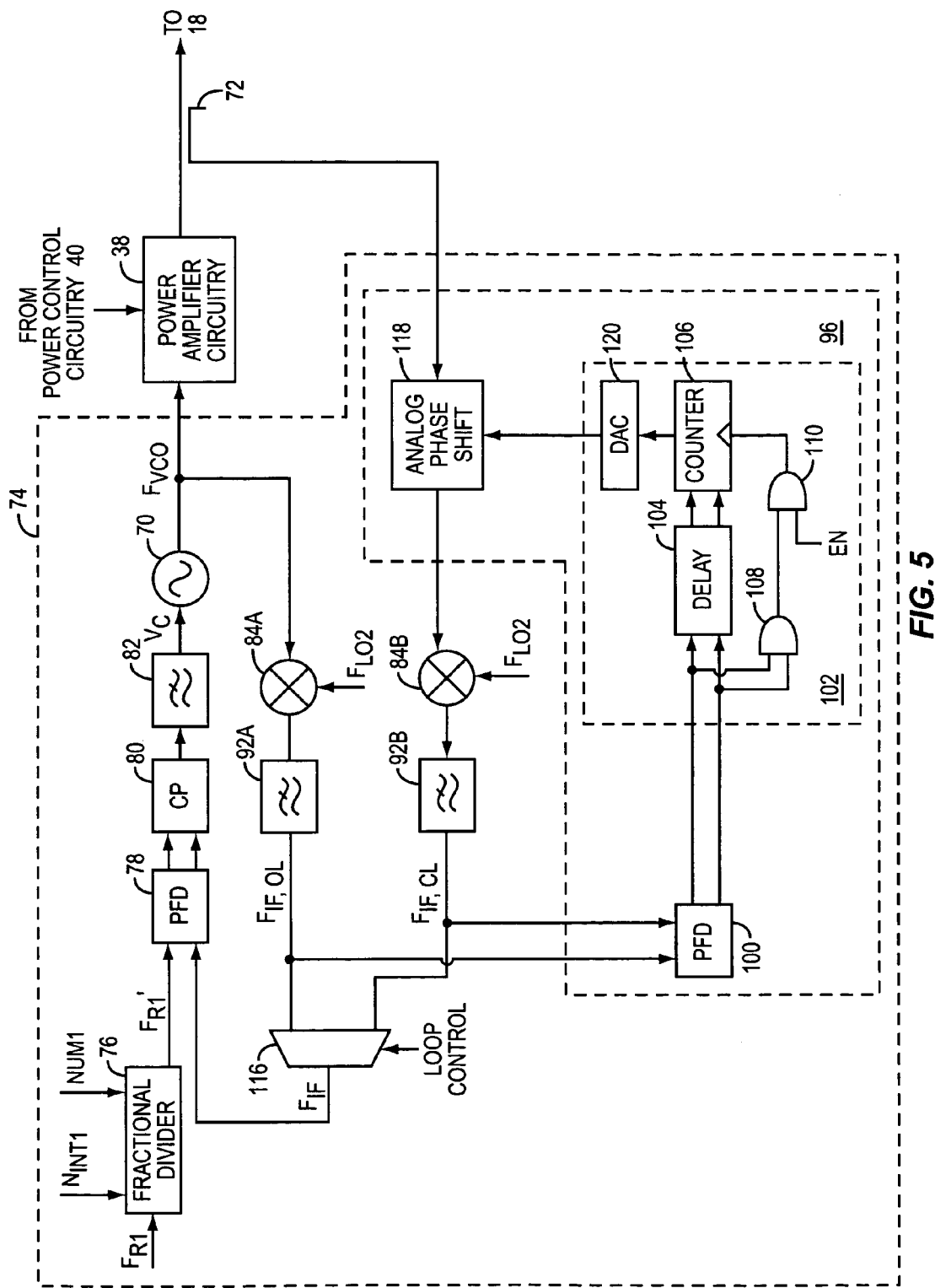
FIG. 5 illustrates a second embodiment of a system for minimizing phase distortion due to switching from the open loop configuration to the closed loop configuration according to the present invention.

Another embodiment of the present invention is illustrated in FIG. 5. This embodiment is similar to that described with respect to FIG. 4, however, the time alignment system 96 includes analog phase shift circuitry 118 rather than the delay circuitry 98 (FIG. 4). More specifically, the time alignment system 96 of FIG. 5 operates to adjust a phase of the feedback signal from the output of the power amplifier circuitry 38 prior to downconversion by the mixer 84B using the analog phase shift circuitry 118.

In operation, the output of the VCO 70 is downconverted by mixer 84A and filtered by filter 92A to provide the downconverted feedback signal ($F_{IF,OL}$), as described above. The feedback signal from the output of the power amplifier circuitry 38 is first provided to the analog phase shift circuitry 118, which operates to adjust a phase of the feedback signal based on a control signal from the control circuitry 102. The output of the analog phase shift circuitry 118 is downconverted by the mixer 84B and filtered by the filter 92B to provide the downconverted feedback signal ($F_{IF,CL}$).

The phase detector 98 compares the phase of the downconverted feedback signal ($F_{IF,CL}$) to the phase of the downconverted feedback signal ($F_{IF,OL}$). Based on the comparison, the phase detector 100 provides the phase detection signal to the control circuitry 102. The control circuitry 102 adjusts a phase shift of the analog phase shift circuitry 118 based on the phase detection signal. After a number of iterations, the phase shift of the analog phase shift circuitry 118 is adjusted such that the two downconverted feedback signals ($F_{IF,OL}$, $F_{IF,CL}$) are in-phase.

As described above, the phase detection signal provided by the phase detector 100 includes a pump-up and a pump-down signal. When the pulse width of the pump-up signal is greater than the pulse width of the pump-down signal, the count provided by the counter 106 is incremented. When the pulse-width of the pump-down signal is greater than the pulse-width of the pump-up signal, the count provided by the counter 106 is decremented. The output of the counter 106 is converted to an analog control signal by a digital-to-analog converter (DAC) 120, and the analog control signal controls the phase shift of the analog phase shift circuitry 118.

Multiplexer 116 receives the downconverted feedback signals ($F_{IF,OL}$, $F_{IF,CL}$) and provides one of these signals as the intermediate frequency signal ($F_{IF}$) based on the loop control signal (LOOP CONTROL). For the open loop configuration, the multiplexer 116 provides the downconverted feedback signal ($F_{IF,OL}$) to the phase detector 78 as the intermediate frequency signal ($F_{IF}$). For the closed loop configuration, the multiplexer 116 provides the phase-adjusted feedback signal ($F_{IF,CL}$) to the phase detector 78 as the intermediate frequency signal ($F_{IF}$).

FIG. 6 illustrates a third embodiment of the present invention. This embodiment is similar to the embodiment of FIG. 4, however, the time alignment system 96 adjusts a phase of the downconverted feedback signal ($F_{IF,OL}$) from the output of the VCO 70 rather than the phase of the downconverted feedback signal ($F_{IF,CL}$) from the output of the power amplifier circuitry 38.

More specifically, the time alignment system 96 operates to adjust a phase of the downconverted feedback signal ($F_{IF,OL}$) from the output of the VCO 70 to provide a phase-adjusted feedback signal ($F_{IF,OL}'$) that is in phase with the downconverted feedback signal ($F_{IF,CL}$). In general, the time alignment system 96 compares the phase of the phase-adjusted feedback signal ($F_{IF,OL}'$) to a phase of the downconverted feedback signal ($F_{IF,CL}$). Based on this comparison, the time alignment system 96 adjusts a phase of the downconverted feedback signal ($F_{IF,OL}$) such that the two feedback signals ($F_{IF,OL}'$, $F_{IF,CL}$) are in-phase.

The time alignment system 96 includes the phase detector 100, the control circuitry 102, and delay circuitry 122. The delay circuitry 122 operates to delay the downconverted feedback signal ($F_{IF,OL}$) provided by the mixer 84A to provide a phase-adjusted feedback signal ($F_{IF,OL}'$). The phase detector 98 compares the phase of the phase-adjusted feedback signal ($F_{IF,OL}'$) to the phase of the downconverted feedback signal ($F_{IF,CL}$). Based on the comparison, the phase detector 100 provides a phase detection signal to the control circuitry 102. The control circuitry 102 adjusts the delay of the delay circuitry 122 based on the phase detection signal. After a number of iterations, the delay of the delay circuitry 122 is adjusted such that the two feedback signals ($F_{IF,OL}'$, $F_{IF,CL}$) are in-phase. The control circuitry 102 may be implemented as disclosed in FIG. 4. The delay circuitry 122 may be similar to the delay circuitry 98 of FIG. 4.

Multiplexer 116 receives the feedback signals ($F_{IF,OL}'$, $F_{IF,CL}$) and provides one of these signals as the intermediate frequency signal ($F_{IF}$) based on the loop control signal (LOOP CONTROL). For the open loop configuration, the multiplexer 116 provides the phase-adjusted feedback signal ($F_{IF,OL}'$) to the phase detector 78 as the intermediate frequency signal ($F_{IF}$). For the closed loop configuration, the multiplexer 116 provides the downconverted feedback signal ($F_{IF,CL}$) to the phase detector 78 as the intermediate frequency signal ($F_{IF}$).

In operation, when it is desirable to initially lock the PLL 54 (FIG. 3), the delay of the delay circuitry 122 is set to an initial value, and the loop control signal (LOOP CONTROL) is provided such that the phase-adjusted feedback signal ($F_{IF,OL}'$) is provided to the phase detector 78. In addition, the mixer 84B may be disabled in order to reduce current drain. When it is desirable to switch from open loop to closed loop, the time alignment system 96 is enabled to adjust the phase of the VCO 70 such the phase-adjusted feedback signal ($F_{IF,OL}'$)

is in-phase with the downconverted feedback signal ($F_{IF,CL}$). Once time alignment is complete, the time alignment system 96 holds the delay of the delay circuitry 122 fixed. The loop control signal (LOOP CONTROL) is then provided such that the multiplexer 116 provides the downconverted feedback signal ($F_{IF,CL}$) to the phase detector 78, thereby enclosing the power amplifier circuitry 38 within the PLL 54 for closed loop operation. Since the downconverted feedback signal ($F_{IF,CL}$) is in phase with the phase-adjusted feedback signal ($F_{IF,OL}'$), there is little or no phase disturbance.

The advantage of the time alignment system 96 of FIG. 6 is that the delay circuitry 122 is only in the feedback path of the VCO 70 and is not in the real signal path, which is the path of the power amplifier circuitry 38. Thus, if there is any noise introduced by the delay circuitry 122, the noise will not have any influence on the RF output signal. However, since the delay circuitry 122 is in the feedback path of the VCO 70, the time alignment system 96 has to allow the PLL 54 (FIG. 3) to settle after each step of the delay of the delay circuitry 122 during time alignment. As a result, the time required to perform time alignment is greater than the time required by the embodiments of FIGS. 4 and 5.

FIG. 7 illustrates yet another embodiment of the present invention. This embodiment is similar to that illustrated in FIG. 5, however, the time alignment system 96 includes analog phase shift circuitry 124 operating to adjust a phase of the feedback signal from the output of the VCO 70 rather than the feedback signal from the output of the power amplifier circuitry 38.

In operation, the output of the power amplifier circuitry 38 is downconverted by mixer 84B and filtered by filter 92B to provide the downconverted feedback signal ($F_{IF,OL}$), as described above. The feedback signal from the output of the VCO 70 is first provided to the analog phase shift circuitry 124, which operates to adjust a phase of the feedback signal based on a control signal from the control circuitry 102. The output of the analog phase shift circuitry 124 is downconverted by the mixer 84A and filtered by the filter 92A to provide the downconverted feedback signal ($F_{IF,OL}$).

The phase detector 100 compares the phase of downconverted feedback signal ($F_{IF,CL}$) to the phase of the downconverted feedback signal ($F_{IF,OL}$). Based on the comparison, the phase detector 100 provides the phase detection signal to the control circuitry 102. The control circuitry 102 adjusts a phase shift of the analog phase shift circuitry 124 based on the phase detection signal. After a number of iterations, the phase shift of the analog phase shift circuitry 124 is adjusted such that the two downconverted feedback signals ($F_{IF,OL}$, $F_{IF,CL}$) are in-phase.

Multiplexer 116 receives the downconverted feedback signals ($F_{IF,OL}$, $F_{IF,CL}$) and provides one of these signals as the intermediate frequency signal ($F_{IF}$) based on the loop control signal (LOOP CONTROL). For the open loop configuration, the multiplexer 116 provides the downconverted feedback signal ($F_{IF,OL}$) to the phase detector 78 as the intermediate frequency signal ($F_{IF}$). For the closed loop configuration, the multiplexer 116 provides the phase-adjusted feedback signal ($F_{IF,CL}$) to the phase detector 78 as the intermediate frequency signal ($F_{IF}$).

Those skilled in the art will recognize improvements and modifications to the preferred embodiments of the present invention. All such improvements and modifications are considered within the scope of the concepts disclosed herein and the claims that follow.

What is claimed is:

1. A system comprising:
   phase-locked loop circuitry comprising an input, a feedback path, and an output, which is adapted to provide a phase modulated radio frequency (RF) signal based on a phase modulation signal received on the input;
   switching circuitry adapted to couple the feedback path of the phase-locked loop circuitry to the output of the phase-locked loop circuitry for open loop operation and couple the feedback path to an output of power amplifier circuitry adapted to amplify the phase modulated RF signal for closed loop operation; and
   time alignment circuitry adapted to time align a feedback signal from the output of the power amplifier circuitry and a feedback signal from the output of the phase-locked loop circuitry prior to the switching circuitry switching the feedback path of the phase-locked loop circuitry from the output of the phase-locked loop circuitry to the output of the power amplifier circuitry.

2. The system of claim 1 wherein the time alignment circuitry is further adapted to adjust a phase of the feedback signal from the output of the power amplifier circuitry to provide a phase-adjusted feedback signal that is time aligned with the feedback signal from the output of the phase-locked loop circuitry.

3. The system of claim 1 wherein the time alignment circuitry is further adapted to adjust a phase of the feedback signal from the output of the phase-locked loop circuitry to provide a phase-adjusted feedback signal that is time aligned with the feedback signal from the output of the power amplifier circuitry.

4. The system of claim 1 wherein the phase-locked loop circuitry further comprises:
   first downconversion circuitry coupled to the output of the phase-locked loop circuitry and adapted to downconvert the feedback signal from the output of the phase-locked loop circuitry to provide a downconverted open loop feedback signal to a first input of the switching circuitry; and
   second downconversion circuitry coupled to the output of the power amplifier circuitry and adapted to downconvert the feedback signal from the output of the power amplifier circuitry to provide a downconverted closed loop feedback signal;
   wherein the time alignment circuitry is adapted to adjust a phase of the downconverted closed loop feedback signal to provide a phase-adjusted feedback signal to a second input of the switching circuitry that is time aligned with the downconverted open loop feedback signal.

5. The system of claim 4 wherein the phase-locked loop circuitry further comprises:
   a phase detector having a first input adapted to receive a first signal and a second input coupled to an output of the switching circuitry and adapted to provide a phase detection signal based on a comparison of a phase of the first signal and a phase of an output signal of the switching circuitry;
   loop circuitry adapted to provide a control signal based on the phase detection signal; and
   a controlled oscillator adapted to provide the phase modulated RF signal based on the control signal;
   wherein for open loop operation the switching circuitry provides the downconverted open loop feedback signal to the second input of the phase detector as the output signal such that the second input of the phase detector is coupled to the output of the phase-locked loop circuitry, and for closed loop operation the switching circuitry provides the phase-adjusted feedback signal to the second input of the phase detector as the output signal such that the second input of the phase detector is coupled to the output of the power amplifier circuitry.

6. The system of claim 5 wherein the phase-locked loop circuitry further comprises a fractional divider adapted to divide a reference signal based on the phase modulation signal to provide the first signal.

7. The system of claim 4 wherein the time alignment circuitry comprises:
delay circuitry adapted to delay the downconverted closed loop feedback signal based on a delay control signal to provide the phase-adjusted feedback signal;
a phase detector adapted to provide a phase detection signal based on a comparison of a phase of the downconverted open loop feedback signal and a phase of the phase-adjusted feedback signal; and
control circuitry adapted to provide the delay control signal based on the phase detection signal.

8. The system of claim 1 wherein the time alignment circuitry is coupled to the output of the power amplifier circuitry and is adapted to adjust a phase of the feedback signal from the output of the power amplifier circuitry to provide a phase-adjusted feedback signal and the phase-locked loop circuitry further comprises:
first downconversion circuitry coupled to the output of the phase-locked loop circuitry and adapted to downconvert the feedback signal from the output of the phase-locked loop circuitry to provide a downconverted open loop feedback signal to a first input of the switching circuitry; and
second downconversion circuitry coupled to an output of the time alignment circuitry and adapted to downconvert the phase-adjusted feedback signal to provide a downconverted closed loop feedback signal to a second input of the switching circuitry.

9. The system of claim 8 wherein the phase-locked loop circuitry further comprises:
a phase detector having a first input adapted to receive a first signal and a second input coupled to an output of the switching circuitry and adapted to provide a phase detection signal based on a comparison of a phase of the first signal and a phase of an output signal of the switching circuitry;
loop circuitry adapted to provide a control signal based on the phase detection signal; and
a controlled oscillator adapted to provide the phase modulated RF signal based on the control signal;
wherein for open loop operation the switching circuitry provides the downconverted open loop feedback signal to the second input of the phase detector as the output signal such that the second input of the phase detector is coupled to the output of the phase-locked loop circuitry, and for closed loop operation the switching circuitry provides the downconverted closed loop feedback signal to the second input of the phase detector as the output signal such that the second input of the phase detector is coupled to the output of the power amplifier circuitry.

10. The system of claim 9 wherein the phase-locked loop further comprises a fractional divider adapted to divide a reference signal based on the phase modulation signal to provide the first signal.

11. The system of claim 8 wherein the time alignment circuitry comprises:
phase shift circuitry adapted to adjust the phase of the feedback signal from the output of the power amplifier circuitry based on a phase-shift control signal to provide the phase-adjusted feedback signal;
a phase detector adapted to provide a phase detection signal based on a comparison of a phase of the downconverted open loop feedback signal and a phase of the downconverted closed loop feedback signal; and
control circuitry adapted to provide the phase shift control signal based on the phase detection signal.

12. The system of claim 1 wherein the phase-locked loop circuitry further comprises:
first downconversion circuitry coupled to the output of the phase-locked loop circuitry and adapted to downconvert the feedback signal from the output of the phase-locked loop circuitry to provide a downconverted open loop feedback signal to a first input of the switching circuitry; and
second downconversion circuitry coupled to the output of the power amplifier circuitry and adapted to downconvert the feedback signal from the output of the power amplifier circuitry to provide a downconverted closed loop feedback signal;
wherein the time alignment circuitry is adapted to adjust a phase of the downconverted open loop feedback signal to provide a phase-adjusted feedback signal to a second input of the switching circuitry that is time aligned with the downconverted closed loop feedback signal.

13. The system of claim 12 wherein the phase-locked loop circuitry further comprises:
a phase detector having a first input adapted to receive a first signal and a second input coupled to an output of the switching circuitry and adapted to provide a phase detection signal based on a comparison of a phase of the first signal and a phase of an output signal of the switching circuitry;
loop circuitry adapted to provide a control signal based on the phase detection signal; and
a controlled oscillator adapted to provide the phase modulated RF signal based on the control signal;
wherein for open loop operation the switching circuitry provides the phase-adjusted feedback signal to the second input of the phase detector as the output signal such that the second input of the phase detector is coupled to the output of the phase-locked loop circuitry, and for closed loop operation the switching circuitry provides the downconverted closed loop feedback signal to the second input of the phase detector as the output signal such that the second input of the phase detector is coupled to the output of the power amplifier circuitry.

14. The system of claim 13 wherein the phase-locked loop further comprises a fractional divider adapted to divide a reference signal based on the phase modulation signal to provide the first signal.

15. The system of claim 12 wherein the time alignment circuitry comprises:
delay circuitry adapted to delay the downconverted open loop feedback signal based on a delay control signal to provide the phase-adjusted feedback signal;
a phase detector adapted to provide a phase detection signal based on a comparison of a phase of the phase-adjusted feedback signal and a phase of the downconverted closed loop feedback signal; and
control circuitry adapted to provide the delay control signal based on the phase detection signal.

16. The system of claim 1 wherein the time alignment circuitry is coupled to the output of the phase-locked loop circuitry and is adapted to adjust a phase of the feedback signal from the output of the phase-locked loop circuitry to provide a phase-adjusted feedback signal and the phase-locked loop circuitry further comprises:
   first downconversion circuitry coupled to the output of the time alignment circuitry and adapted to downconvert the phase-adjusted feedback signal to provide a downconverted open loop feedback signal to a first input of the switching circuitry; and
   second downconversion circuitry coupled to an output of the power amplifier circuitry and adapted to downconvert the feedback signal from the output of the power amplifier circuitry to provide a downconverted closed loop feedback signal to a second input of the switching circuitry.

17. The system of claim 16 wherein the phase-locked loop circuitry further comprises:
   a phase detector having a first input adapted to receive a first signal and a second input coupled to an output of the switching circuitry and adapted to provide a phase detection signal based on a comparison of a phase of the first signal and a phase of an output signal of the switching circuitry;
   loop circuitry adapted to provide a control signal based on the phase detection signal; and
   a controlled oscillator adapted to provide the phase modulated RF signal based on the control signal;
   wherein for open loop operation the switching circuitry provides the downconverted open loop feedback signal to the second input of the phase detector as the output signal such that the second input of the phase detector is coupled to the output of the phase-locked loop circuitry, and for closed loop operation the switching circuitry provides the downconverted closed loop feedback signal to the second input of the phase detector as the output signal such that the second input of the phase detector is coupled to the output of the power amplifier circuitry.

18. The system of claim 17 wherein the phase-locked loop further comprises a fractional divider adapted to divide a reference signal based on the phase modulation signal to provide the first signal.

19. The system of claim 16 wherein the time alignment circuitry comprises:
   phase shift circuitry adapted to adjust the phase of the feedback signal from the output of the phase-locked loop circuitry based on a phase-shift control signal to provide the phase-adjusted feedback signal;
   a phase detector adapted to provide a phase detection signal based on a comparison of a phase of the downconverted open loop feedback signal and a phase of the downconverted closed loop feedback signal; and
   control circuitry adapted to provide the phase shift control signal based on the phase detection signal.

20. The system of claim 1 further comprising the power amplifier circuitry adapted to amplify the phase modulated RF signal to provide an RF output signal.

21. A method comprising:
   providing phase-locked loop circuitry adapted to provide a phase modulated radio frequency (RF) signal based on a phase modulation signal;
   switching a feedback path of the phase-locked loop circuitry from an output of the phase-locked loop circuitry to an output of power amplifier circuitry adapted to amplify the phase modulated RF signal; and
   time aligning a feedback signal from the output of the power amplifier circuitry and a feedback signal from the output of the phase-locked loop circuitry prior to switching the feedback path of the phase-locked loop circuitry from the output of the phase-locked loop circuitry to the output of the power amplifier circuitry.

22. The method of claim 21 wherein time aligning the feedback signals from the outputs of the phase-locked loop circuitry and the power amplifier circuitry comprises adjusting a phase of the feedback signal from the output of the power amplifier circuitry to provide a phase-adjusted feedback signal that is time aligned with the feedback signal from the output of the phase-locked loop circuitry.

23. The method of claim 21 wherein time aligning the feedback signals from the outputs of the phase-locked loop circuitry and the power amplifier circuitry comprises adjusting a phase of the feedback signal from the output of the phase-locked loop circuitry to provide a phase-adjusted feedback signal that is time aligned with the feedback signal from the output of the power amplifier circuitry.

\* \* \* \* \*